(12) United States Patent
Ohshima (10) Patent No.: US 6,824,411 B2
(45) Date of Patent: Nov. 30, 2004

(54) SOCKET FOR ELECTRICAL PARTS (75) Inventor: Hisao Ohshima, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 09/725,101

(22) Filed: Nov. 29, 2000

(65) Prior Publication Data

US 2001/0002345 A1 May 31, 2001

(30) Foreign Application Priority Data

Nov. 29, 1999 (JP) ............................................. 11-337252

(51) Int. Cl.$^7$ ............................................. H01R 23/72
(52) U.S. Cl. ...................................... 439/266; 439/330
(58) Field of Search ................................. 439/266, 265, 439/267, 268, 73, 72, 330

(56) References Cited

U.S. PATENT DOCUMENTS

| 4,496,205 A | * | 1/1985 | Christensen et al. | 439/266 |
| 5,186,642 A | * | 2/1993 | Matsuoka et al. | 439/268 |
| 5,320,550 A | * | 6/1994 | Uratsuji et al. | 439/266 |
| 5,669,780 A | * | 9/1997 | Fukunaga | 439/266 |
| 5,807,127 A | * | 9/1998 | Ohshima | 439/266 |
| 6,139,348 A | * | 10/2000 | Fukunaga | 439/266 |
| 6,149,449 A | * | 11/2000 | Abe | 439/268 |

* cited by examiner

Primary Examiner—Hien Vu
(74) Attorney, Agent, or Firm—Staas & Halsey LLP (57) ABSTRACT

A socket for an electrical part comprises a socket body having a stationary portion to which a number of contact pins are disposed so as to be contacted to or separated from a number of terminals disposed to an electrical part, each of the contact pins having first and second contact portions between which each of the terminals is clamped. The socket body is provided with a slide plate to be transversely slidable in a usable state of the socket, and one of the first and second contact portions is displaced by sliding the slide plate to thereby open or close the first and second contact portions. The stationary portion is formed with a first guide portion for guiding a front side end edge portion, of the electrical part, in a sliding direction of the slide plate at a time of opening the contact portions of the contact pin and the slide plate is formed with a second guide portion for guiding the front side end edge portion thereof in the sliding direction of the slide plate at a time of closing the contact portions.

7 Claims, 12 Drawing Sheets

PRIOR ART

FIG.12

PRIOR ART

SOCKET FOR ELECTRICAL PARTS

BACKGROUND OF THE INVENTION

1. Field of the Invention

The present invention relates to a socket for an electrical part for detachably holding an electrical part such as semiconductor (called "IC package" herein) having, particularly, an improved structure of a guide structure for guiding the electrical part at a time of accommodation thereof into a socket.

2. Prior Art of the Invention

In the known art, there has been provided an IC socket as a "socket for an electrical part" for detachably holding an IC package as an "electrical part".

Figure 10A:
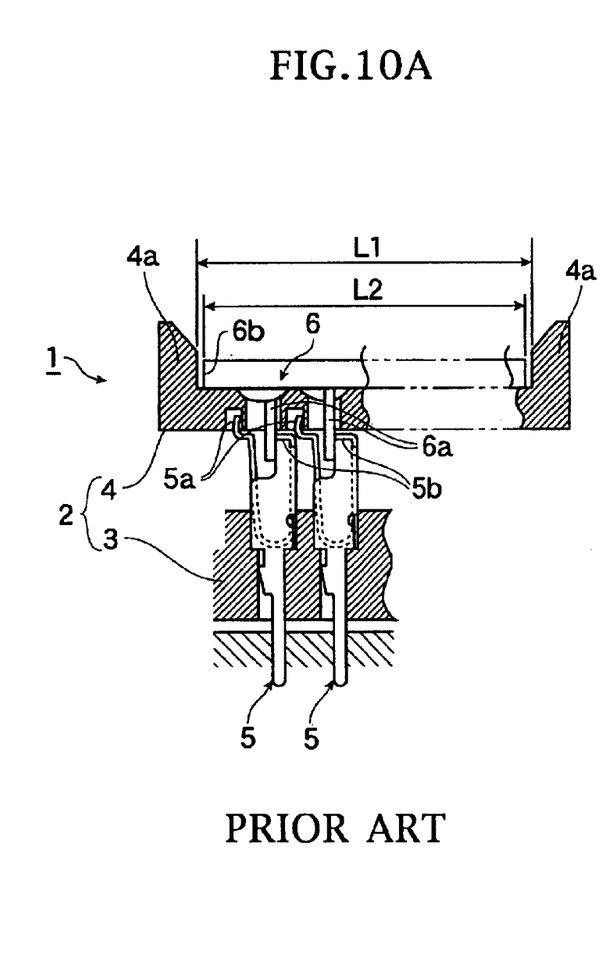
Figure 10B:
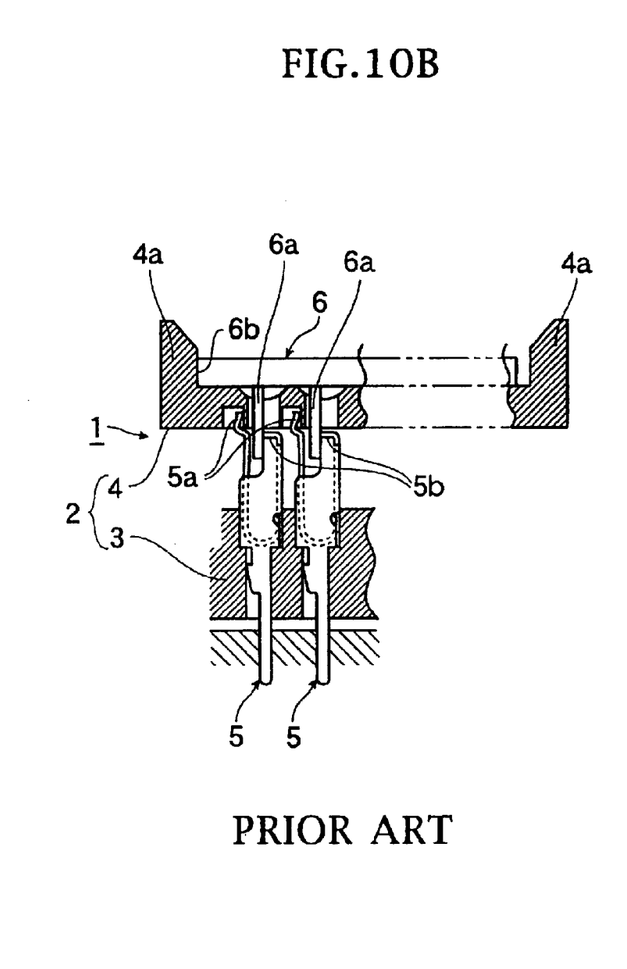

FIGS. 10A and 10B, for example, show a portion of such IC socket 1, which comprises a socket body 2 of so-called a two-body structure having a base 3 and a slide plate 4 disposed on the upper side of the base 3 to be slidable thereon. A number of contact pins 5 are disposed to the base 3 of the socket body 2.

Each of the contact pin 5 are formed, at its upper portion, with an elastically deformable movable contact portion 5a and a stationary contact portion 5b. When the slide plate 4 is slid, in the left side direction in the figures, the movable contact portion 5a is elastically deformed to thereby widen the distance between both the contact portions 5a and 5b as shown in FIG. 10A and, on the other hand, when the slide plate 4 is slid in the right side direction, the distance between these contact portions 5a and 5b is made narrow as shown in FIG. 10B.

Furthermore, the slide plate 4 has a structure capable of accommodating an IC package 6, and guide portions 4a for guiding the IC package 6 to a predetermined position are disposed to both end edge portions of the slide plate 4 so as to project upward.

According to such structure, when the IC package 6 is mounted to the predetermined position, the slide plate 4 is slid in the left side direction as shown in FIG. 10A so as to open the distance between both the contact portions 5a and 5b of the contact pin 5. Under the state, the IC package 6 is guided by the guide portions 4a at both end edge portions of the slide plate 4 to thereby mount the IC package 6 to the predetermined position on the slide plate 4. During this operation, a terminal 6a having a pin-shape of the IC package 6 is inserted between both the contact portions 5a and 5b. A number of such terminals are disposed so as to correspond to the contact pins 5, respectively.

Thereafter, when the slide plate 4 is moved in the right side direction as viewed in FIG. 10B, the movable contact portion 5a is returned by an elastic force thereof so as to clamp the terminal 6a between both the contact portions 5a and 5b and hence establish an electrical connection therebetween.

Figure 11:
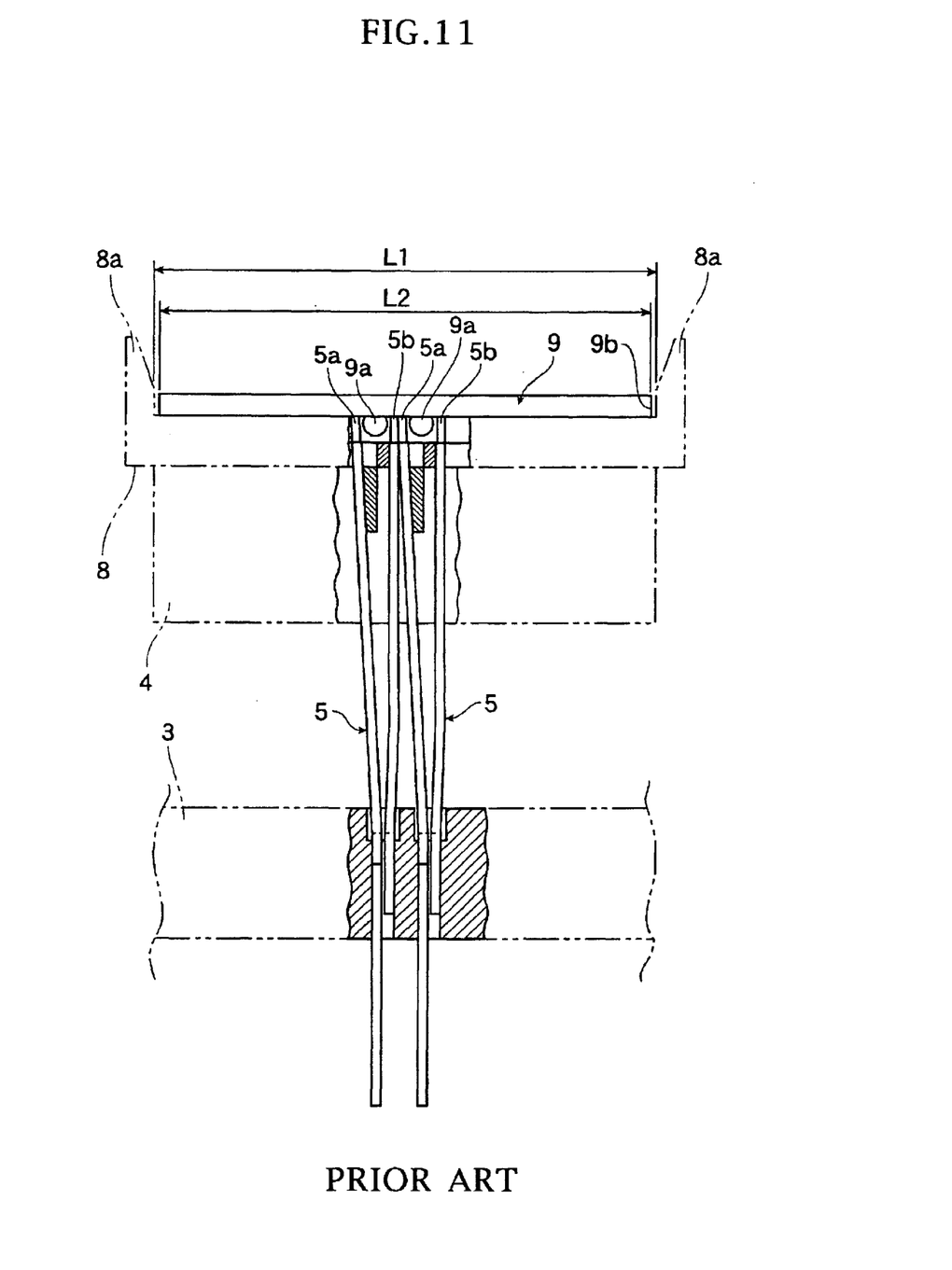
FIG. 11 is a partially sectional view showing another conventional example corresponding to FIG. 8, in which the contact pin is opened.
Figure 12:
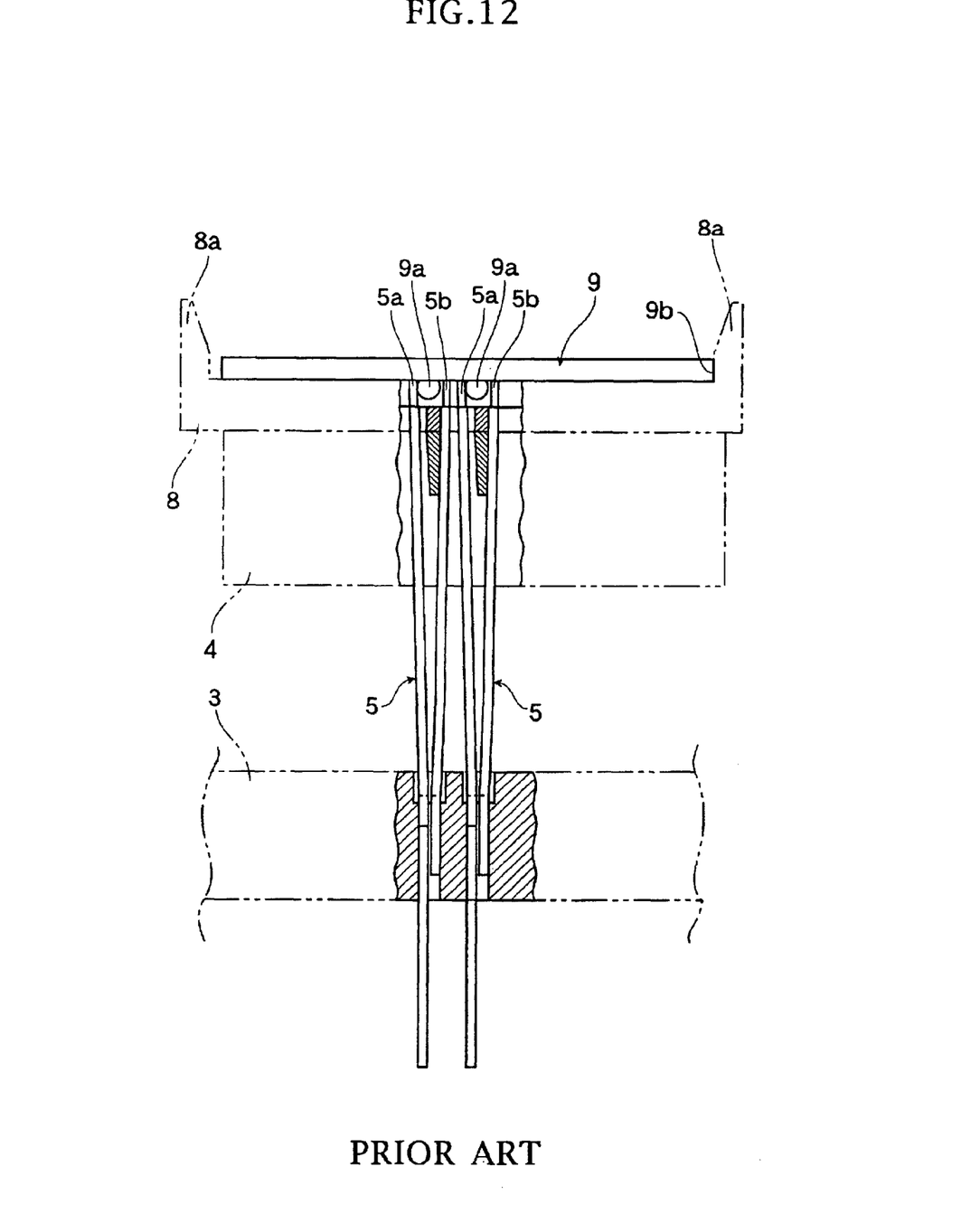
FIG. 12 is a partially sectional view showing the example of FIG. 8 corresponding to FIG. 9, in which the contact pin is closed.

FIGS. 11 and 12 show other conventional examples of the IC socket 1, in which a top plate 8, as a stationary portion, is disposed on the base 3 through the slide plate 4.

When the slide plate 4 is slid in the left side direction as viewed in FIG. 11, the movable contact portion 5a of the contact pin 5 is elastically deformed so as to open the distance between both the contact portions 5a and 5b. Under the state, an IC package 9 is guided by guide portions 8a disposed at both end edge portions of the top plate 8 to thereby mount the IC package 9 to the predetermined position on the top plate 8. During this operation, a solder ball 9a as a terminal of the IC package 9 is inserted between both the contact portions 5a and 5b.

Thereafter, when the slide plate 4 is moved in the right side direction, the movable contact portion 5a is returned by an elastic force thereof so as to push the solder ball 9a of the IC package 9 to thereby slide the IC package 9 in the right direction (FIG. 12), and hence to clamp the solder ball 9a between both the contact portions 5a and 5b, thus establishing an electrical connection therebetween.

However, with the conventional structure shown in FIGS. 10A and 10B, the guide portions 4a for guiding both the end edge portions of the IC package 6 is formed to both end portions in the moving direction of the slide plate 4. Then, according to this structure, when the distance L1 between these guide portions 4a is set to be slightly wider than the width L2 of the IC package 6, there is a fear of giving an adverse affect on the contacting state between the contact portions 5a and 5b and the pin-shaped terminal 6a. That is, by setting the distance L1 between these guide portions 4a to be slightly wider than the width L2 of the IC package 6, the IC package 6 can be mounted to the predetermined position of the slide plate 4. However, under such setting, when the slide plate 4 is moved from the state shown in FIG. 10A to the state shown in FIG. 10B, the pin-shaped terminal 6a of the IC package 6 abuts against the stationary contact portion 5b of the contact pin 5, and thereby, rightward movement of the IC package 6 is limited and the guide portions 4a of the slide plate 4 interfere with the left side end edge portion 6b of the IC package 6. Thus, the movement of the slide plate 4 is limited, the returning amount of the movable contact portion 5a is made small, and hence, the movable contact portion 5a is not sufficiently contacted to the pin-shaped terminal 6a, thus providing a problem (see FIG. 10B).

Further, with the conventional structure of FIGS. 11 and 12, the guide portions 8a for guiding both the end edge portions of the IC package 9 are formed to both the end portions of the top plate 8. Then, according to such structure, when the distance L1 between both the guide portions 8a is set to be slightly wider than a width L2 of the IC package 9, there is a fear of giving an adverse affect on the contacting state between the contact portions 5a and 5b and the solder ball 9a of the IC package 9. That is, by moving the slide plate 4 rightward, the solder ball 9a of the IC package 9 is pressed during the returning motion of the movable contact portion 5a to thereby slide the IC package in the right direction as viewed in figures. Therefore, the right end edge portion 9b of the IC package 9 interferes with the guide portions 8a, thus limiting the movement thereof and, hence, there is a fear of providing an insufficient contact state between the stationary contact portion 5b and the solder ball 9a.

SUMMARY OF THE INVENTION

An object of the present invention is to substantially eliminate defects or drawbacks encountered in the prior art mentioned above and to provide a socket for electrical parts capable of ensuring a good guiding performance of the electrical part at the accommodation time thereof as well as achieving a good contact condition of a contact pin to a terminal of the electrical part.

This and other objects can be achieved according to the present invention by providing, in one aspect, a socket for an electrical part which comprises a socket body having a stationary portion to which a number of contact pins are disposed so as to be contacted to or separated from a number of terminals, respectively, disposed to an electrical part, each of the contact pins having first and second contact portions between which each of the terminals is clamped, the socket body being provided with a slide plate to be transversely slidable in a usable state of the socket, and in which one of said first and second contact portions is displaced by sliding the slide plate to thereby open or close the first and second contact portions, wherein the stationary portion is formed with a first guide portion for guiding a front side end edge portion, of the electrical part, in a sliding direction of the slide plate at a time of opening the contact portions of the contact pin and the slide plate is formed with a second guide portion for guiding the front side end edge portion, of the electrical part, in the sliding direction of the slide plate at a time of closing the contact portions of the contact pin.

In a preferred embodiment, the slide plate is mounted to an upper portion of the stationary portion of the socket body to be movable and the electrical part is mounted on the slide plate. The stationary portion of the socket body comprises a base member on which the contact pins are arranged, and the first guide portion is provided for the base member and said second guide portion is provided for the slide plate.

Further, it may be possible that the stationary portion of the socket body comprises a base member on which the contact pins are arranged and a top plate on which the electrical part is mounted, the slide plate being disposed between the base portion and the slide plate and the first guide portion being provided for the top plate and the second guide portion being provided for the slide plate.

In a more detailed aspect, there is provided a socket for an electrical part comprising:

a socket body having a stationary portion;

a number of contact pins disposed to the stationary portion so as to be contacted to or separated from a number of terminals, respectively, disposed to an electrical part, each of the contact pins having first and second contact portions between which each of the terminals is clamped;

a slide plate provided for the socket body to be transversely slidable in a usable state of the socket;

an operation member provided for the socket body and adapted to transversely move the slide plate when the operation member is moved vertically; and a guide structure including a first guide portion formed to the stationary portion for guiding a front side end edge portion, of the electrical part, in a sliding direction of the slide plate at a time of opening the contact portions of the contact pin and including a second guide portion formed to the slide plate for guiding the front side end edge portion, of the electrical part, in the sliding direction of the slide plate at a time of closing the contact portions of the contact pin.

According to the subject matters of the present invention mentioned above, the socket for an electrical part is formed with guide portions including a first guide portion formed to the stationary portion for guiding a front side end edge portion, of the electrical part, in a sliding direction of the slide plate at a time of opening the contact portions of the contact pin and including a second guide portion formed to the slide plate for guiding the front side end edge portion, of the electrical part, in the sliding direction of the slide plate at a time of closing the contact portions of the contact pin. Accordingly, the electrical part such as IC package can be surely guided to be mounted by means of the guide structure and the interference between the guide portions and the electrical part can be effectively prevented, thus realizing a stable contacting state between the terminal of the electrical part and the contact pin.

The nature and further characteristic features of the present invention will be made more clear from the following descriptions made with reference to the accompanying drawings.

BRIEF DESCRIPTION OF THE DRAWINGS

In the accompanying drawings:

FIG. 7 includes sectional views showing an operation of the first embodiment and includes FIG. 7A showing a state that a contact pin is opened and FIG. 7B showing a state that the contact pin is closed;

FIG. 10 shows a conventional example and includes FIGS. 10A and 10B corresponding to FIGS. 7A and 7B, respectively;

DESCRIPTION OF THE PREFERRED EMBODIMENTS

Preferred embodiments of the present invention will be described hereunder with reference to the accompanying drawings.

Further, it is first to be noted that the terms "upper", "lower", "vertical", "horizontal" and like described herein are used in the illustrated state or usable state of the socket or members associated therewith and also that a number of contact pins and terminals are actually arranged, though the description may be made with reference to single one thereof for the sake of easy understanding of the present invention.

[First Embodiment]

With reference to FIGS. 1 to 7 representing the first embodiment of the present invention, an IC socket as a "socket for an electrical part" is denoted by the reference numeral 1, and the IC socket 11 is one for carrying out an electrical connection between a pin-shaped terminal 12b as a "terminal" of an IC package 12 as an "electrical part" and a printed circuit board, not shown, of a measuring device such as tester for carrying out a performance test of the IC package 12.

The IC package 12 is so-called a PGA (Pin Grid Array) type, in which a number of pin-shaped terminals 12b project in a matrix arrangement from a lower surface of a package body 12a having a rectangular shape.

The IC socket 11 has a socket body 13 to be disposed on the printed circuit board, and the socket body 13 is provided with a base 16 as a "stationary portion" to which contact pins 14 are disposed and a slide plate 15 disposed on the base 16 to be slidable.

Figure 6:
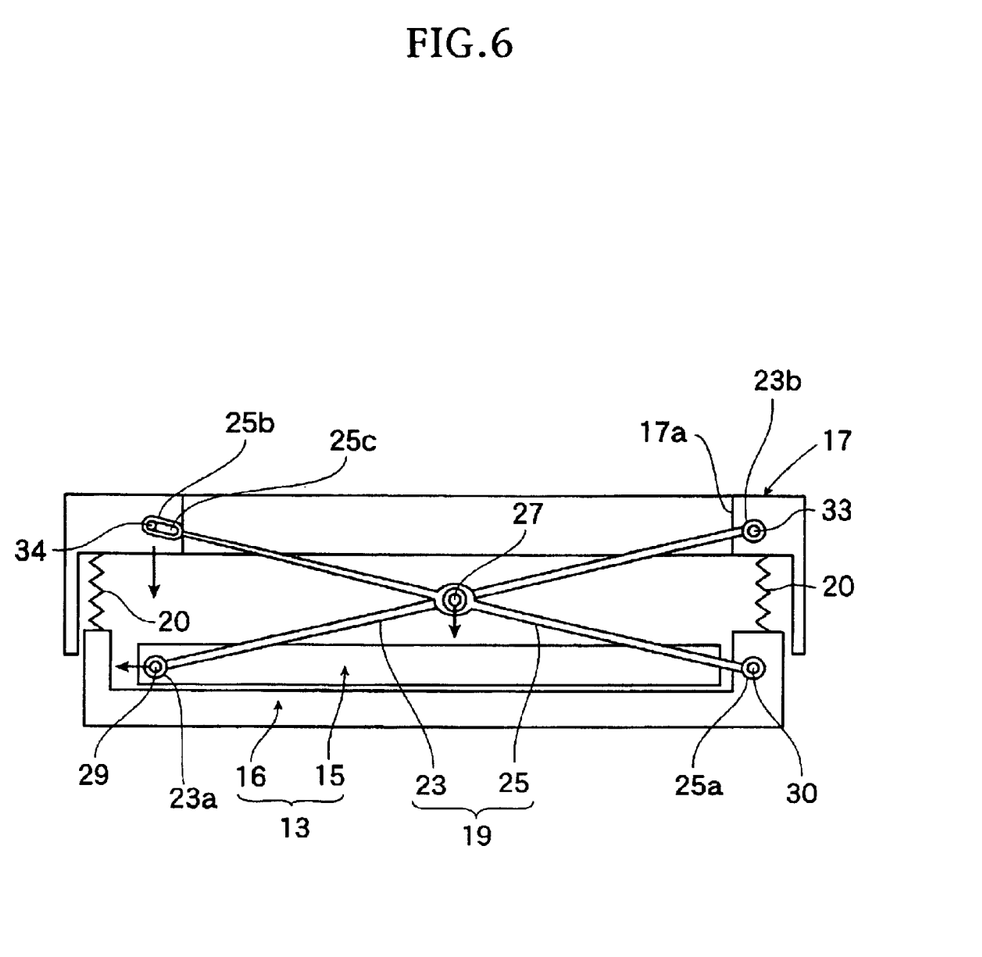
FIG. 6 is an illustration of a front view of an X-shaped link in connection with the first embodiment of FIG. 1.

The slide plate 15 is disposed to be transversely movable in the lateral direction in FIG. 6, and by transversely moving the slide plate 15 by a mechanism which will be mentioned hereinlater, the contact pin 14 arranged to the socket body 13 is elastically deformed and then displaced.

Figure 5:
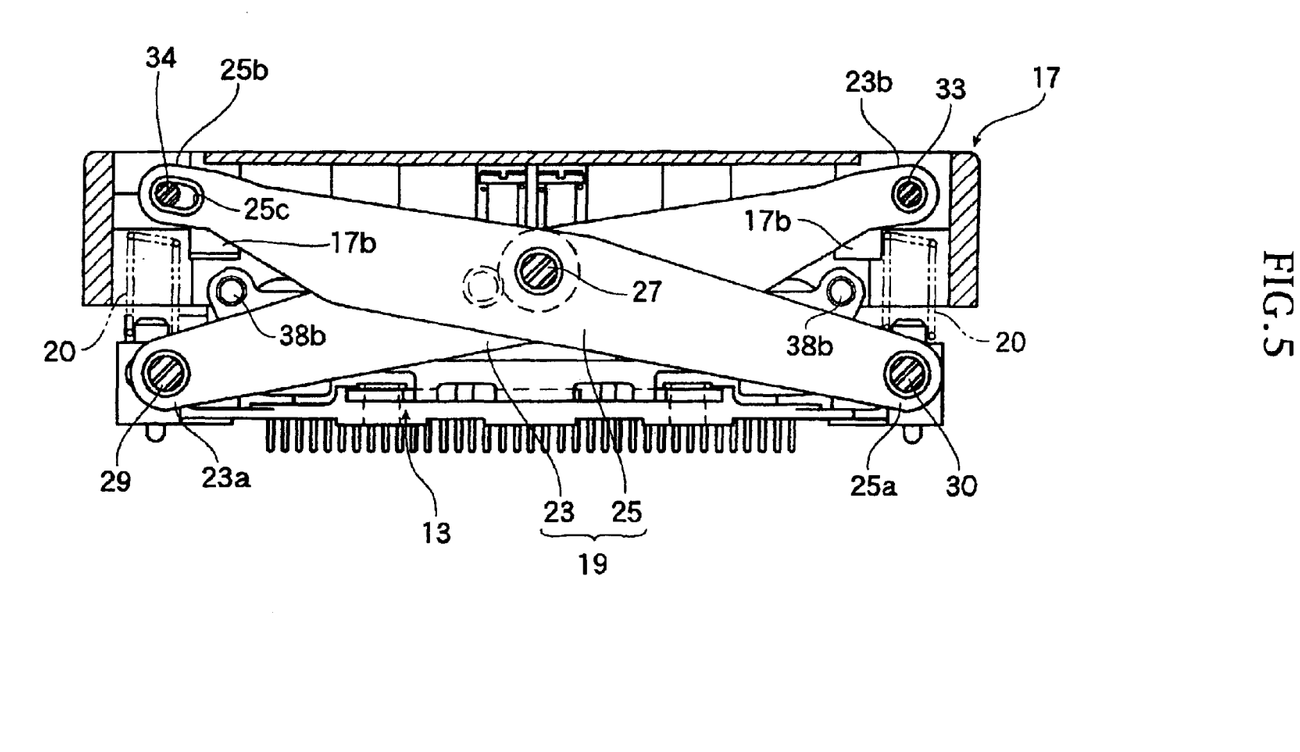
FIG. 5 is a sectional view taken along the line V—V in FIG. 1.

Furthermore, an operation member 17 having a rectangular frame structure is disposed to the socket body 13 to be vertically movable, and by vertically moving the operation member 17, the slide plate 15 is transversely moved through an operation of an X-shaped link 19 shown in FIGS. 5 and 6.

Figure 7A:
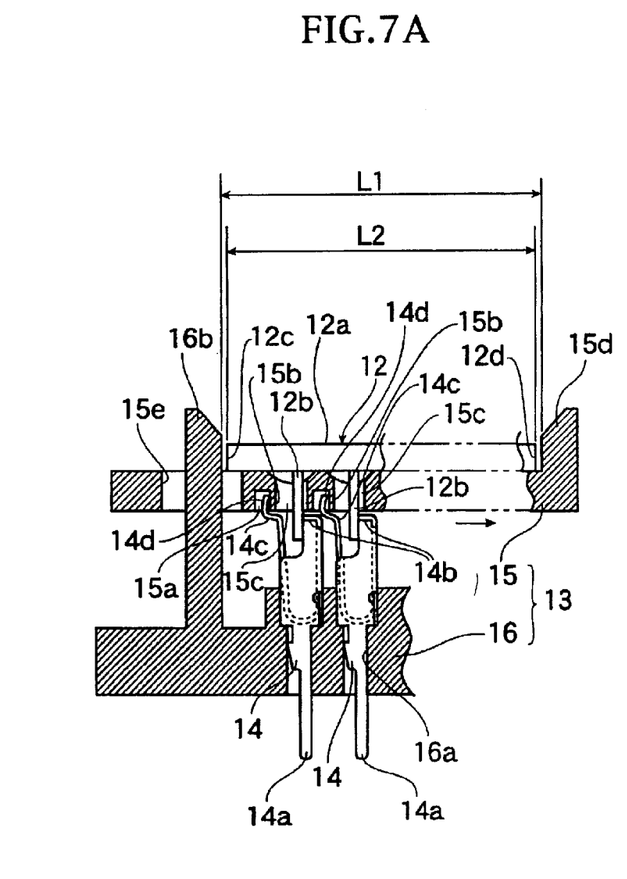
Figure 7B:
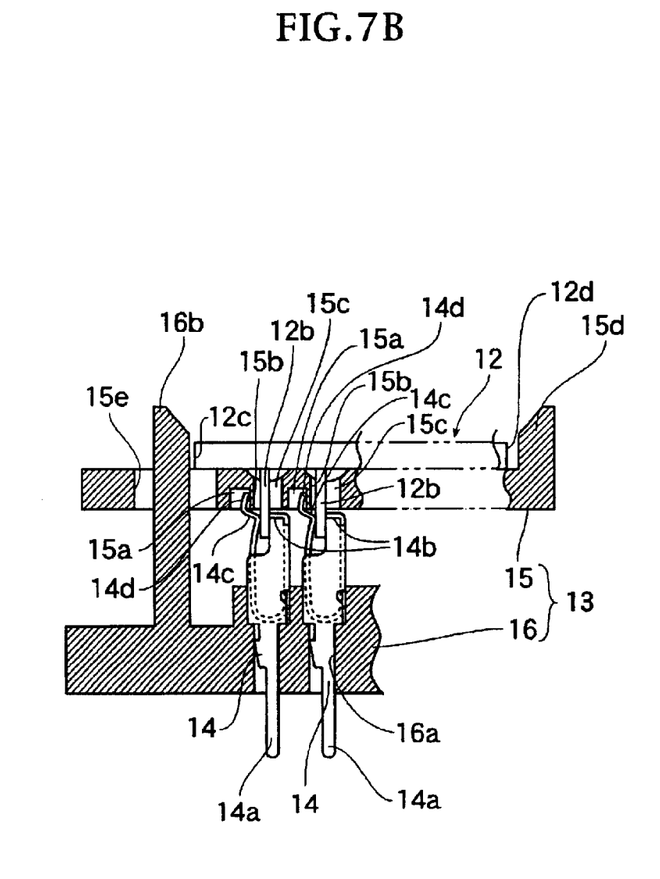

More in detail, the contact pin 14 has a springy property as shown in FIGS. 7A and 7B and is formed from a plate member having a good conductivity. The contact pin 14 is press-fitted into a press-fit hole 16a formed to the base 16 and fixed thereto. A lead 14a projects downward from the base 16 and this lead 14a is electrically connected to the printed circuit board. The contact pin 14 is formed, at its upper portion, with a stationary contact portion 14b and a movable contact portion 14c between which the pin-shaped terminal 12b of the IC package 12 is clamped to thereby establish an electrical connection therebetween.

An upper end portion 14d of the movable contact portion 14c is inserted into an insertion hole 15a of the slide plate 15 and then engaged with an engaging portion 15b. Then, when the slide plate 15 is slid, the movable contact portion 14c is elastically deformed and a distance between both the contact portions 14b and 14c is widened as shown in FIG. 7A.

Furthermore, the slide plate 15 provides a rectangular structure on which the IC package 12 is mounted, and the pin-shaped terminal 12b of the IC package 12 is inserted into the insertion hole 15c of the slide plate 15.

Still furthermore, a movable side guide portion 15d and a stationary side guide portion 16b for guiding both end edge portions of the IC package 12 when it is mounted are formed respectively to the slide plate 15 and the base 16 of the socket body 13.

The stationary side guide portion 16b is formed to a position (left side in FIG. 7) for guiding the front end edge portion 12c, of the IC package 12, in the moving direction of the slide plate 15 at a time of opening the contact pin 14. On the other hand, the movable side guide portion 15d is formed to a position (right side in FIG. 7) for guiding the front end edge portion 12d, of the IC package 12, in the moving direction of the slide plate 15 at a time of closing the contact pin 14.

The stationary side guide portion 16b is idly fitted into an opening 15e of the slide plate 15 as shown in FIGS. 7A and 7B to thereby allow the slide plate 15 to be moved.

Furthermore, with reference to FIG. 7A, showing the slide plate opened state, a distance L1 between the movable side guide portion 15d and the stationary side guide portion 16b is set to be slightly wider than a lateral width L2 of the IC package 12 (width of the slide plate in its moving direction) so as to provide a good guidance at the time of mounting the IC package 12.

Figure 1:
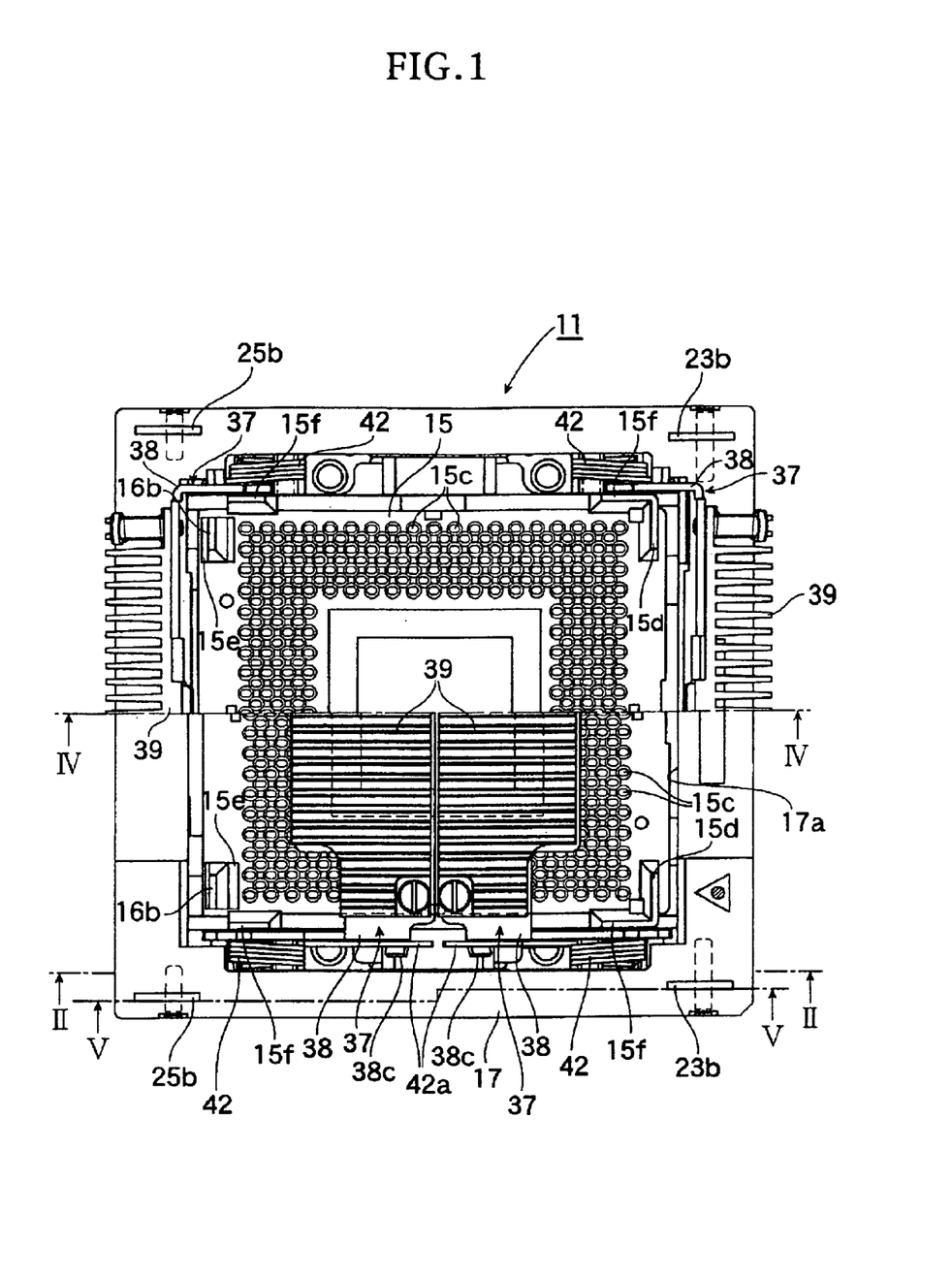
FIG. 1 is a plan view of an IC socket according to a first embodiment of the present invention.

Still furthermore, as shown in FIG. 1, side guide portions 15f for positioning the IC package 12, at the time of mounting the same, in a direction normal to the moving direction of the slide plate 15 as shown are formed to four positions corresponding to the respective corner portions of the rectangular IC package 12.

Figure 2:
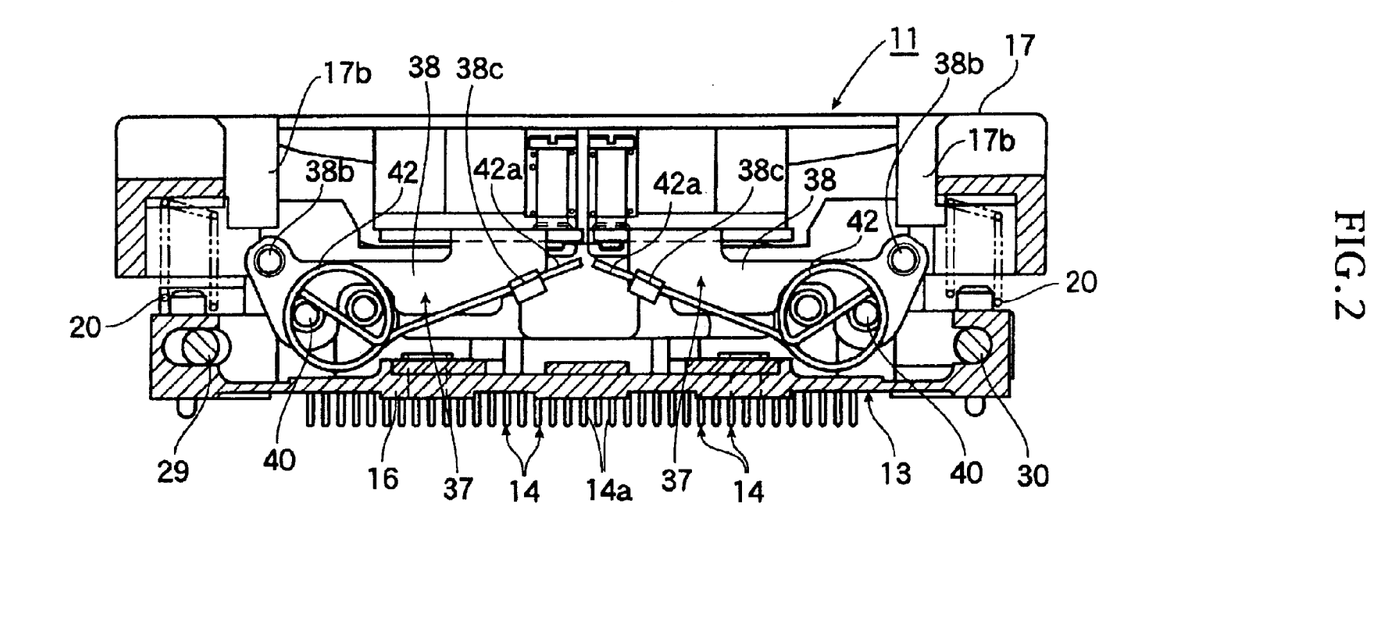
FIG. 2 is a sectional view taken along the line II—II in FIG. 1.
Figure 3:
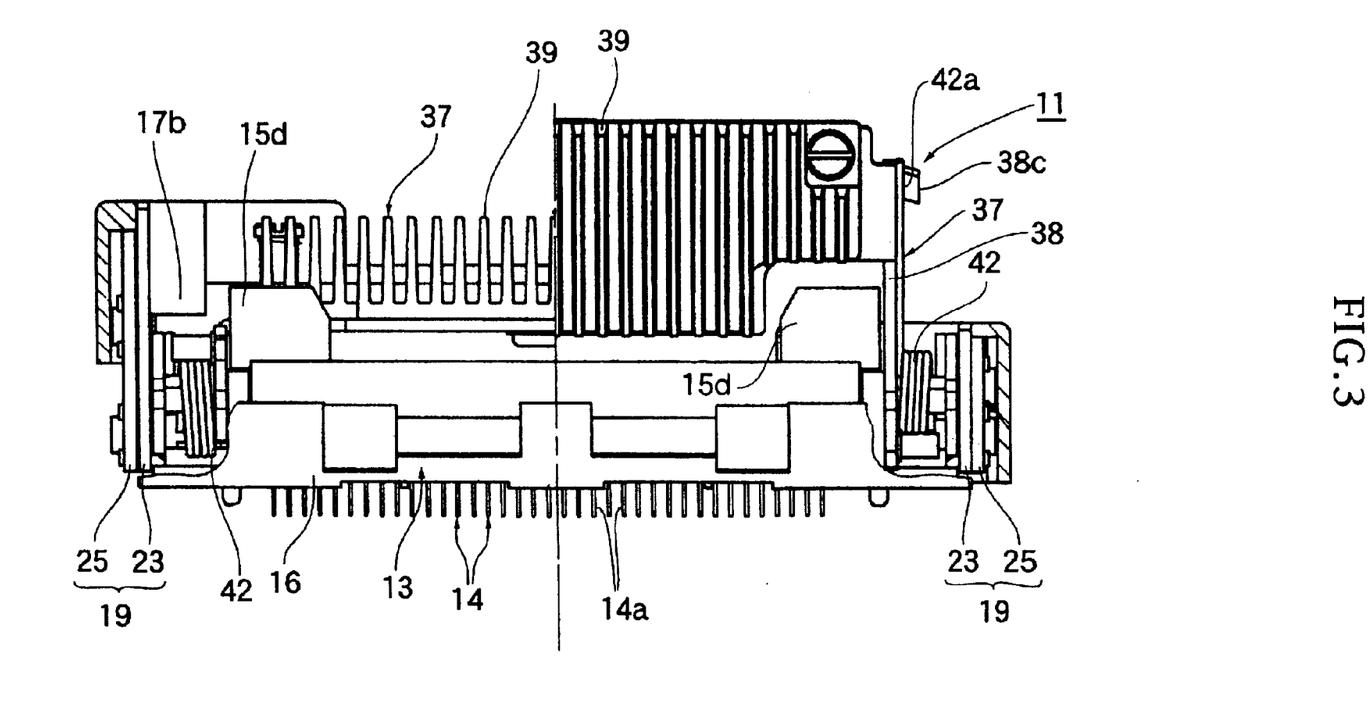
FIG. 3 is a right side view of FIG. 1, partially broken away, of the IC socket of FIG. 1.

The operation member 17 has, as shown in FIG. 1, a rectangular frame structure having an opening 17a of a size capable of the IC package 12 being inserted. The IC package 12 is mounted on the slide plate 15 through this opening 17a of the operation member 17. The operation member 17 is disposed to the socket body 13 to be vertically movable, and as shown in FIG. 2, the operation member 17 is urged upward by means of spring 20 disposed between the operation member 17 and the socket body 13.

The X-shaped link 19 is disposed at a portion corresponding to each of side surface portions along the transversely moving direction of the rectangular slide plate 15.

More in detail, the X-shaped link 19 comprises, as shown in FIGS. 5 and 6, a first link member 23 and a second link member 25 which have the same length and which are connected to be rotatable by means of central connection pin 27.

The first link member 23 has a lower end portion 23a which is connected to one end portion of the side surface portions along the transversely moving direction of the slide plate 15 to be rotatable by means of lower end connection pin 29. The second link member 25 has a lower end portion 25a which is connected to the base 16 to be rotatable by means of lower end connection pin 30. These first and second link members 23 and 25 have upper end portions 23b and 25b which are connected to the operation member 17 to be rotatable by means of upper connection pins 33 and 34, respectively. A slot (long hole) 25c is formed to the upper end portion 25b of the second link member 25, and the upper connection pin 34 is slidably inserted into the slot 25c and then connected.

According to the structure mentioned above, when the operation member 17 is lowered, the slide plate 15 is slid in an arrowed direction in FIG. 6 through the motion of the X-shaped links 19.

Figure 4:
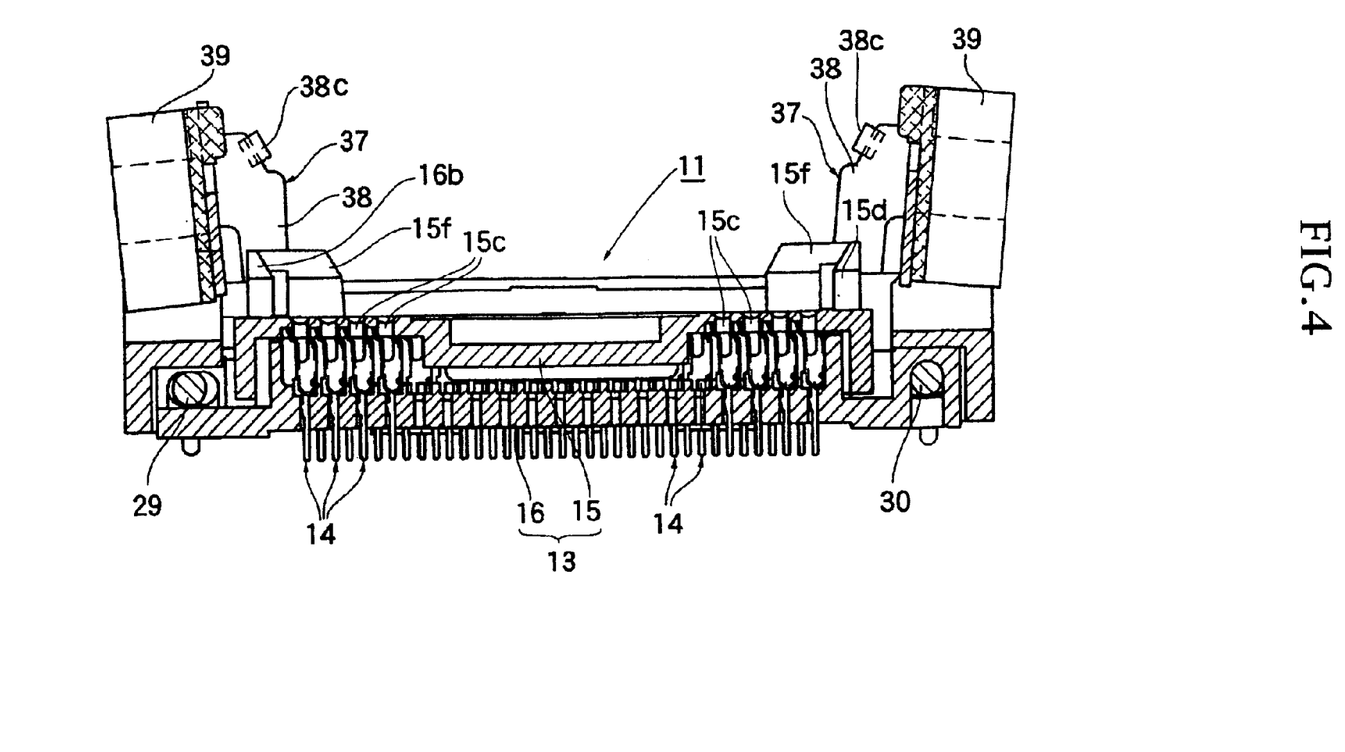
FIG. 4 is a sectional view taken along the line IV—IV in FIG. 1.

Furthermore, as shown in FIG. 4, a pair of open/close members 37 are disposed to the base 16 of the socket body 13 to be pivotal as so-called double-leafed hinged door structure (French door structure). The open/close member 37 comprises a pivotal arm 38 having substantially a gate shape and a heat sink 39 disposed to a central portion of the pivotal arm 38 and adapted to release heat through abutment against a tip of the IC package 12. The heat sink 39 is, for example, formed through an aluminium die-casting and hence provides a good conductivity.

The pivotal arm 38 is provided, as shown in FIG. 2, for the base 16 to be rotatable through a rotation shaft (i.e. pivotal pin) 40. The pivotal arm 38 is formed, at its one end side, with a force acting shaft 38b which is pressed by a pressing portion 17b of the operation member 17.

Furthermore, a spring 42 is disposed so as to urge the open/close member 37 in a closing direction thereof, and the spring 42 is wound up around the periphery of the rotation shaft 40 and one end portion 42a of the spring 42 is engaged with an engaging piece 38c formed to the front end side of the pivotal arm 38. According to such structure, the urging force of the spring 42 is set to urge the front end portion of the open/close member 37 in the closing direction thereof.

In the IC socket 11 of the structure mentioned above, the IC package 12 is mounted to the socket body 13 in the following manner.

First, the operation member 17 is depressed downward by, for example, an automatic machine against the urging force of the spring 20. Then, the force acting shafts 38b of the pivotal arms 38 of the open/close members 37 are pressed and the open/close members 37 are rotated about the rotation shafts 40 against the urging force of the springs 20. In the state that the open/close members 37 are opened maximally, the open/close members 37 have substantially its vertical (standing) attitude as shown in FIG. 4 retired from the insertion (mounting) range of the IC package 12.

When the operation member 17 is lowered, the slide plate 15 is slid leftward through the operation of the X-shaped links 19, and then, the movable contact portion 14c of the contact pin 14 is pressed by the engaging portion 15b of the slide plate 15 to be thereby elastically deformed, thus opening the distance between the paired contact portions 14b and 14c of each of the contact pins 14.

Under the state, the IC package 12 is guided by the respective guide portions 15d, 15f and 16b and then mounted on the slide plate 15. In this operation, since the distance L1 between the movable side guide portion 15d and the stationary guide portion 16b is set to be slightly wider than the width L2 of the IC package 12, the IC package 12 can be surely guided to the predetermined position of the slide plate 15 of the socket body 13. Then, the pin-shaped terminal 12b of the IC package 12 is inserted into the opened contact portions 14b and 14c as shown in FIG. 7A.

In the next step, when the pressing force to the operation member 17 is released, the operation member 17 is moved upward by the urging force of the spring 20, the slide plate 15 is slid rightward, through the operation of the X-shaped links 19, from the state shown in FIG. 7A to the state shown in FIG. 7B to thereby return the movable contact portion 14c of the contact pin 14 to its initial position by the elastic force thereof, and then, the pin-shaped terminal 12b of the IC package 12 is clamped between the paired contact portions 14b and 14c of each of the contact pins 14 without contacting the stationary guide portion 16b or the movable guide portion 15d.

During this operation, since the stationary guide portion 16b is formed to the base 16 and is not moved even if the slide plate 15 is slid, the stationary guide portion 16b does not interfere with the IC package 12, which is different from the conventional structure. Moreover, since the movable guide portion 15d is formed to the slide plate 15 and is moved together therewith, the movable guide portion 15d does also not interfere with the IC package 12. Accordingly, the movement of the slide plate 15 is not limited or restricted, the return amount of the movable contact portion 14c can be ensured, and hence, the pin-shaped terminal 12b can be surely clamped between both the contact portions 14b and 14c, thus ensuring the improved contact stability.

At the same time, when the operation member is moving upward, the open/close members 37 are closed pivotally about the rotation shafts 40 by the urging force of the springs 42, and the heat sinks 39 abut against the tip portion of the IC package 12, thus achieving the heat radiation therefrom.

[Second Embodiment]

Figure 8:
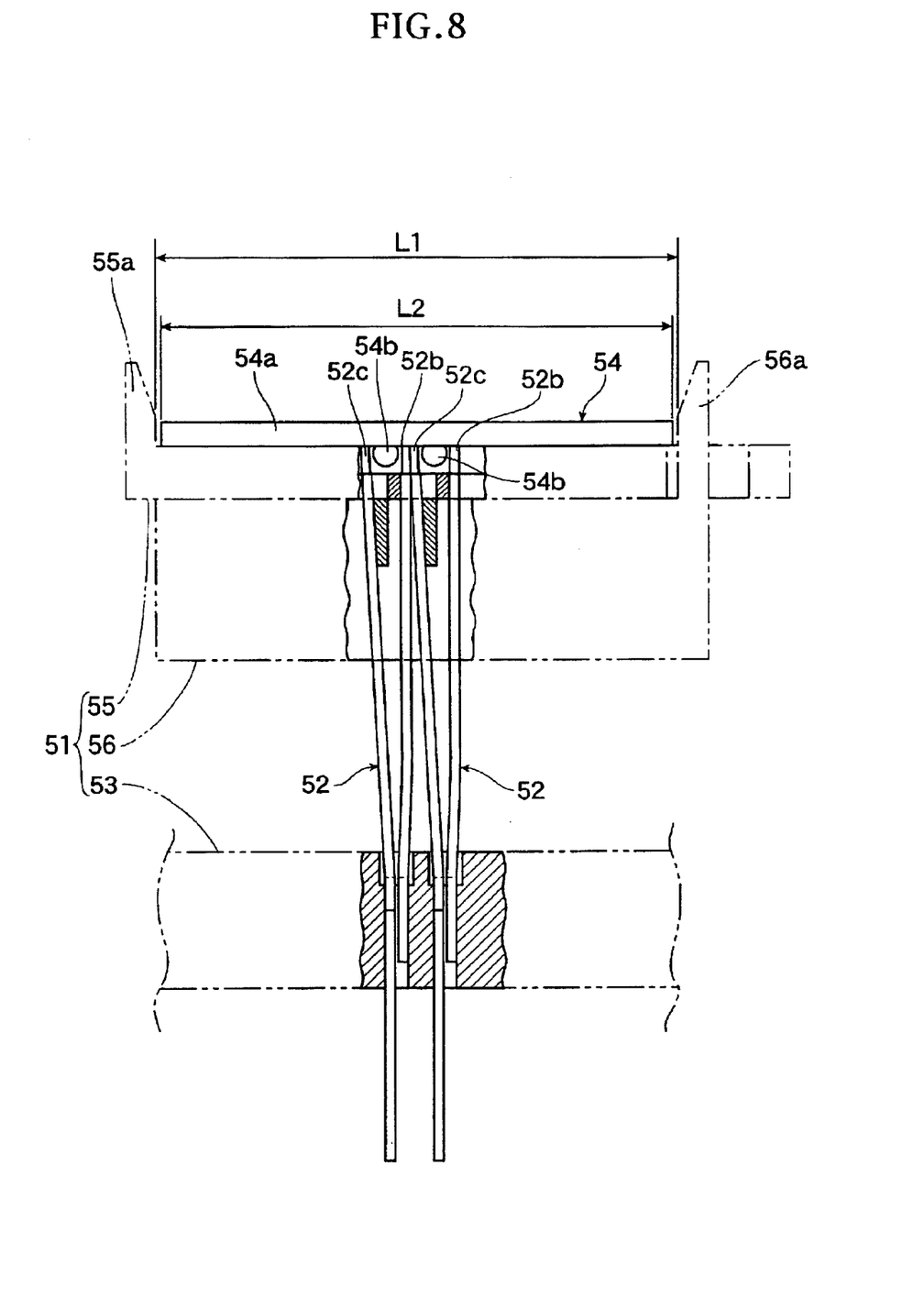
FIG. 8 is a partially sectional view of a contact pin for explaining an operation of a second embodiment of the present invention.
Figure 9:
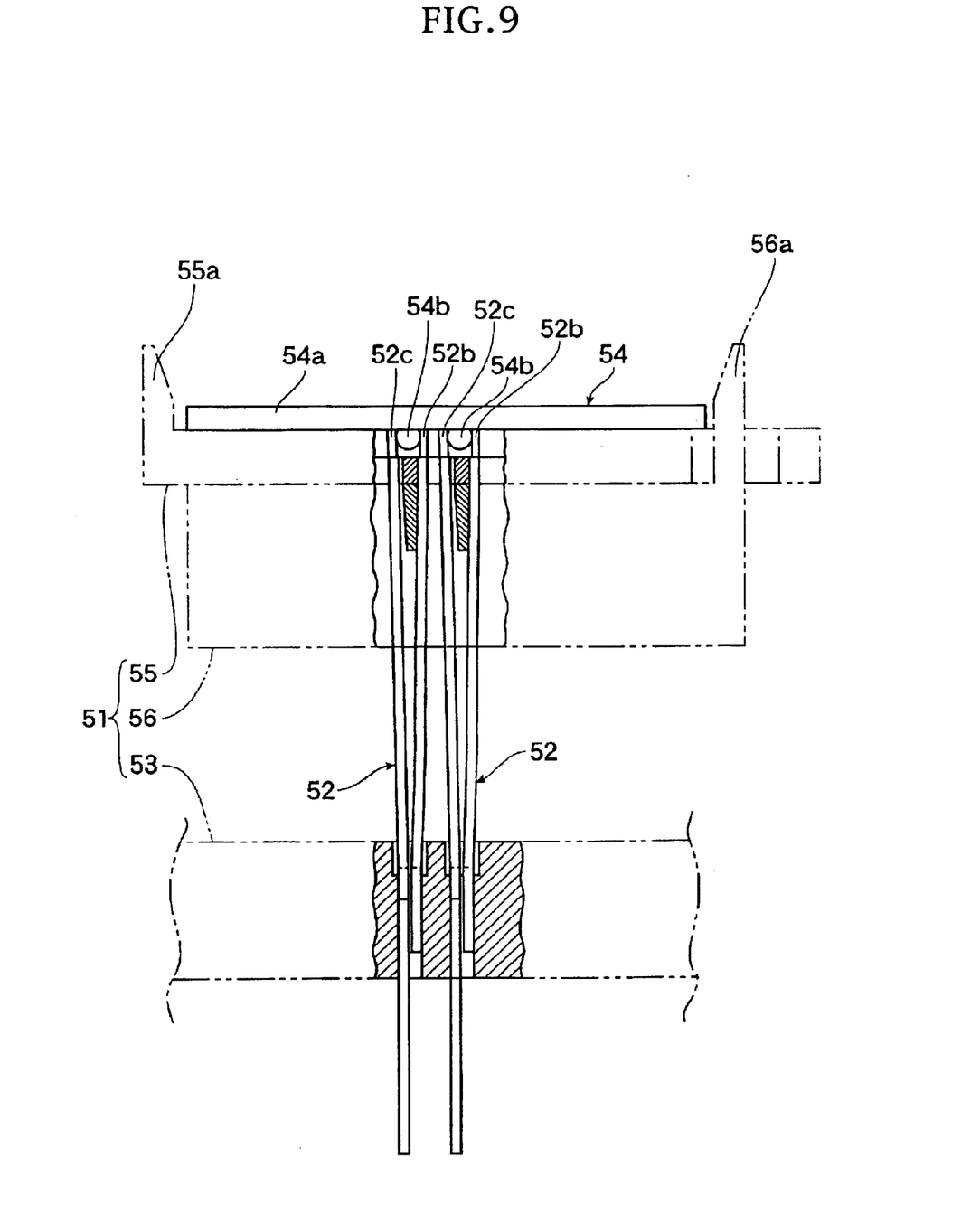
FIG. 9 is a partially sectional view of the contact pin, now closed, for explaining the operation thereof.

FIGS. 8 and 9 represent the second embodiment of the present invention.

Although, in the first embodiment, the socket body 13 has so-called a two-member structure comprising the base 16 as the "stationary (fixed) portion" and the slide plate 15, in this second embodiment, a "stationary portion" of a socket body 51 comprises a base 53 on which contact pins 52 are arranged and a top plate 55 on which an IC package 54 is mounted, and a slide plate 56 is disposed between the base 53 and the top plate 56.

The IC package 54 of this embodiment is so-called a BGA type (Ball Grid Array type), in which the IC package 54 has a rectangular package body 54a, and a number of solder balls 54b are disposed to the lower surface of the package body 54a in a matrix arrangement.

The slide plate 56 is formed with a movable side guide portion 56a for guiding a front side end edge portion in the closing direction of the movable contact portion 52c of the contact pin 52, and on the other hand, the top plate 55 is formed with a stationary side guide portion 55a for guiding a front side end edge portion in the opening direction of the movable contact portion 52c of the contact pin 52.

According to this second embodiment of the structure mentioned above, when an operation member, not shown, but similar to that of the first embodiment, is lowered, the slide plate 56 is slid leftward in the figures through the operation of X-shaped links, not shown, and the movable contact portion 52c is elastically deformed to thereby widen the distance between the stationary contact portion 52b and the movable contact portion 52c of the contact pin 52. Under the state, when the IC package 54 is mounted on the top plate 55, the IC package 54 can be surely guided to the predetermined position by the stationary side guide portion 55a and the movable side guide portion 56a with high precision.

Thereafter, when the operation member is moved upward, the slide plate 56 is moved rightward in the figures and, hence, the movable contact portion 52c returns by its elastic force. Then, a solder ball 54b of the IC package 54 is pressed and the IC package 54 is also moved in the rightward direction. However, in this embodiment, since the movable side guide portion 56a is formed to the slide plate 56 and, hence, is moved together with the slide plate 56 in the rightward direction. Therefore, the IC package 54 does not interfere with the movable side guide portion 56a, thus ensuring the movement (displacement) amount of the IC package 54 in the rightward direction, and since the solder ball 54b abuts against the stationary contact portion 52b and slightly elastically deforms it, the contacting pressure between the solder ball 54b and both the contact portions 52a and 52b and the contacting stability can be also improved.

The structures other than that mentioned above are substantially the same as those in the first embodiment, so that the details thereof are omitted herein.

It is further to be noted that, in the described embodiments, although the contact pin is provided with a pair of movable contact portion and stationary contact portion between which the terminal or solder ball of the IC package is held and clamped, the present invention is not limited to this structure and the contact pin may be formed with a pair of movable contact portions which are both deformable and displaceable.

Furthermore, in the described embodiments, the IC socket is mentioned as preferred embodiment of the socket for electrical parts, but the present invention is not limited to the application to such IC socket and may be applied to other devices, and the slide plate 15 may be slid by a mechanism other than the X-shaped link 19.

What is claimed is:

1. A socket for an electrical part which comprises a socket body having a stationary portion to which a plurality of contact pins are disposed so as to be contacted to and separated from a plurality of terminals, respectively, disposed to said electrical part, each of said contact pins having a first and a second contact portion between which each of said terminals is clamped, paid socket body being provided with a slide plate to be transversely slidable in use, end in which one of said first and second contact portions is displaced by sliding the slide plate to thereby open or close the first and second contact portions, wherein said stationary portion comprises:

a first guide portion for guiding a first front side end edge of the electrical part in a first transverse sliding direction of the slide plate at a time of opening the contact portions of the contact pin, the first front side end edge being perpendicular to the first transverse sliding direction of the slide plate, said slide plate comprises a second guide portion for guiding a second front side end edge of the electrical part in a second transverse sliding direction of the slide plate at a time of closing the contact portions of the contact pin, the second front side end edge being perpendicular to the second transverse sliding direction of the slide plate and parallel to the first front side end edge, and the stationary portion being placed on either an upper side or a lower side of the slide plate, the first guide portion being on the stationary portion and extending upward beyond the slide plate when the first guide portion is either on the upper side or the lower side of the slide plate, the second guide portion being on the slide plate and extending upward beyond a top plate of the stationary portion on which the electrical part is mounted when the top plate is on the upper side of the slide plate, and the first and second guide portions not being in contact with the electrical part at the time of closing, and a distance between the first and the second guide portions, when the electrical part is accommodated on the socket, is wider than a width of the electrical part.

2. A socket for an electrical part according to claim 1, wherein said slide plate is mounted to an upper portion of said stationary portion of the socket body to be movable and the electrical part is mounted on the slide plate.

3. A socket for an electrical part according to claim 1, wherein said stationary portion of the socket body comprises a base member on which the contact pins are arranged, and said first guide portion is provided for the base member and said second guide portion is provided for the slide plate.

4. A socket for an electrical part according to claim 1, wherein said stationary portion of the socket body comprises a base member on which the contact pins are arranged, said slide plate being disposed between the base portion and the top plate and said first guide portion being provided for the top plate and said second guide portion being provided for the slide plate.

5. A socket for an electrical part according to claim 1, wherein the distance between the first and the second guide portions is wider than the width of the electrical part, after the time of closing.

6. A socket for an electrical part comprising:

a socket body having a stationary portion;

a plurality of contact pins disposed to said stationary portion so as to be contacted to and separated form a plurality of terminals, respectively, disposed to said electrical part, each of said contact pins having a first and second contact portion between which each of said terminals is clamped; and a slide plate provided for the socket body to be transversely slidable in use;

an operation member provided for the socket body and adapted to transversely move the slide plate when said operation member is moved vertically;

the stationary portion comprising a first guide portion for guiding a first front side end edge of the electrical part in a first transverse sliding direction of the slide plate at a time of opening the contact portions of the contact pin, the first front side end edge being perpendicular to the first transverse sliding direction of the slide plate, and said slide plate comprising a second guide portion for guiding a second front side end edge of the electrical part in a second transverse sliding direction of the slide plate at a time of closing the contact portions of the contact pin, the second front side end edge being perpendicular to the second transverse sliding direction of the slide plate and parallel to the first front side end edge, the stationary portion being placed on either an upper side or a lower side of the slide plate, the first guide portion being on the stationary portion and extending upward beyond the slide plate when the first guide portion is either on the upper side or the lower side of the slide plate, the second guide portion being on the slide plate and extending upward beyond a top plate of the stationary portion on which the electrical part is mounted when the top plate is on the upper side of the slide plate, and the first and second guide portions not being in contact with the electrical part at the time of closing, and a distance between the first and second guide portions, when the electrical part is accommodated in the socket, is wider than a width of the electrical part.

7. A socket to receive an electrical part having a plurality of terminals, the socket comprising:

a body having a stationary portion, a plurality of contact pins being disposed on the stationary portion to contact the plurality of terminals, each of the contact pins having first and second contact portions between which each of the terminals is clamped; and a slide plate, the first and second contact portions being displaced by sliding the slide plate to thereby open or close the first and second contact portions, the stationary portion comprising a first guide portion to guide a first front side end edge of the electrical part in a first transverse sliding direction of the slide plate at a time of opening the contact portions of the contact pins, the first front side end edge being perpendicular to the first transverse sliding direction of the slide plate, the slide plate comprising a second guide portion to guide a second front side end edge portion of the electrical part in a second transverse sliding direction of the slide plate at a time of closing the contact portions of the contact pins, the second front side end edge being perpendicular to the second transverse sliding direction of the slide plate and parallel to the first front side end edge, and the stationary portion being placed on either an upper side or a lower side of the slide plate, the first guide portion being on the stationary portion and extending upward beyond the slide plate when the first guide portion is either on the upper side or the lower side of the slide plate, the second guide portion being on the slide plate and extending upward beyond a top plate of the stationary portion on which the electrical part is mounted when the top plate is on the upper side of the slide plate, and the first and second guide portions not being in contact with the electrical part at the time of closing, and a distance between the first and second guide portions, when the electrical part is accommodated in the socket, is wider than a width of the electrical part.

* * * * *

UNITED STATES PATENT AND TRADEMARK OFFICE
CERTIFICATE OF CORRECTION

PATENT NO.    : 6,824,411 B2
DATED         : November 30, 2004
INVENTOR(S)   : Hisao Ohshima It is certified that error appears in the above-identified patent and that said Letters Patent is hereby corrected as shown below:

Column 8,
Line 59, change "paid" to -- said --.
Line 60, change "end" to -- and --.

Column 9,
Line 47, change "form" to -- from --.

Signed and Sealed this

Third Day of May, 2005

JON W. DUDAS
*Director of the United States Patent and Trademark Office*